(12) United States Patent
Beitelmal et al.

(10) Patent No.: US 6,672,381 B2
(45) Date of Patent: *Jan. 6, 2004

(54) MULTI-LOAD THERMAL REGULATING SYSTEM WITH MULTIPLE SERIAL EVAPORATORS

(75) Inventors: Abdlmonem H. Beitelmal, Palo Alto, CA (US); Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/843,933

(22) Filed: Apr. 30, 2001

(65) Prior Publication Data

US 2002/0157821 A1 Oct. 31, 2002

(51) Int. Cl.[7] ................................................. F24F 3/00
(52) U.S. Cl. ..................... 165/206; 165/263; 62/259.2
(58) Field of Search ................................ 165/206, 263, 165/264, 80.4, 80.5; 62/259.2

(56) References Cited

U.S. PATENT DOCUMENTS

| | | | | | |
|---|---|---|---|---|---|
| 4,084,388 | A | * | 4/1978 | Nelson | 165/206 X |
| 4,571,951 | A | | 2/1986 | Szymaszek | 62/212 |
| 4,729,424 | A | * | 3/1988 | Mizuno et al. | 165/263 X |
| 5,198,752 | A | * | 3/1993 | Miyata et al. | 165/80.4 X |
| 6,000,458 | A | * | 12/1999 | Watanabe | 165/263 X |
| 6,026,896 | A | * | 2/2000 | Hunter | 165/206 |
| 6,089,797 | A | * | 7/2000 | Chen et al. | 165/206 X |
| 6,102,113 | A | * | 8/2000 | Cowans | 165/264 X |
| 6,182,742 | B1 | * | 2/2001 | Takahashi et al. | 62/259.2 X |
| 6,415,619 | B1 | * | 7/2002 | Bash et al. | 62/228.4 |
| 2002/0104646 | A1 | * | 8/2002 | Jeong | 165/206 |
| 2002/0124585 | A1 | * | 9/2002 | Bash et al. | 62/228.4 |
| 2002/0157820 | A1 | * | 10/2002 | Beitelmal et al. | 165/206 |

OTHER PUBLICATIONS

US 5,706,890, 1/1998, Sloan et al. (withdrawn)*

* cited by examiner

Primary Examiner—Ljiljana Ciric

(57) ABSTRACT

A system and method for reducing temperature variation among components in a multi-component system. In this respect, component temperatures are controlled to remain relatively constant (approximately within 5° C.) with respect to other components, while allowing for multiple fluctuating heat loads between components. A refrigeration system possessing a variable capacity (speed) compressor and a thermostatic expansion valve is utilized to control the flow of refrigerant through the refrigeration system. The temperatures of the components are reduced by metering the mass flow rate of the refrigerant cooling the components to compensate for the heat load applied to the refrigeration system. The temperature variation among the components is reduced by supplemental heaters independently providing heat to each respective component. In this regard, any relatively inactive, and therefore relatively cooler, component with respect to other components, may be heated by that component's respective supplemental heater, such that the temperature of the relatively inactive component is not reduced below the specified temperature range.

9 Claims, 2 Drawing Sheets

MULTI-LOAD THERMAL REGULATING SYSTEM WITH MULTIPLE SERIAL EVAPORATORS

FIELD OF THE INVENTION

This invention relates generally to a system for maintaining the temperature of components in an electronic system within a predetermined range. More particularly, the invention pertains to a refrigeration system having multiple evaporators connected in series to cool multiple heat generating components in an electronic system and a supplemental heating system having multiple individual heaters to reduce temperature variation among the components in a multi-component system.

BACKGROUND OF THE INVENTION

The components (e.g., processors, micro-controllers, high speed video cards, disk drives, semi-conductor devices, etc.) of an electronic system are generally known to generate significant amounts of heat. It has been found that the performance and reliability of the heat generating components typically deteriorate as the components become increasingly heated and may cause component failure. Electronic systems are thus generally equipped with a mechanism (e.g., a fan) attached to the housing of the electronic system to cool the components as well as the interior of the electronic system. Although these types of mechanisms have been relatively effective in cooling the components of certain types of electronic systems, they have been found to be relatively insufficient to cool the faster and more powerful components of today's electronics.

With the advent of more powerful components which generate greater amounts of heat, the possibility that the components will overheat has drastically increased. One solution to the overheating problem has been to directly cool the components themselves. In this regard, refrigeration systems have been implemented to directly cool the components. In these types of systems, an evaporator is positioned in thermal contact with a surface of the component to be cooled. These types of systems have been relatively effective in maintaining the temperatures of individual computer components within acceptable ranges. However, when an electronic system possesses a number of components ("multi-component system"), known refrigeration systems suffer from a variety of drawbacks and disadvantages.

For instance, one known technique of reducing the temperature of components in a multi-component system is to rely upon a single refrigeration system possessing a plurality of evaporators aligned in series along each of the components. One disadvantage associated with known serially positioned evaporators is that they generally do not compensate for varying heat loads in the components to substantially reduce the temperature variation among the components. That is, these types of systems do not compensate for the possibility that evaporators positioned downstream from other evaporators may be adversely affected (e.g., downstream evaporators may receive superheated fluid which may actually cause a rise in their temperature). In addition, they do not compensate for the possibility of evaporators positioned relatively upstream and producing a relatively low heat load, may actually be cooled below recommended operating temperatures.

SUMMARY OF THE INVENTION

According to one aspect, the present invention provides for the independent control of individual component temperatures by utilizing supplemental heaters in conjunction with metering the mass flow rate of refrigerant to a series of evaporators in a multi-load refrigeration system based on the heat load of the system without suffering from the drawbacks and disadvantages associated with known refrigeration systems.

According to a preferred embodiment, the present invention relates to a thermal regulating system for maintaining individual temperatures of a plurality of components within a predetermined temperature range. The thermal regulating system includes a refrigeration system having a refrigerant contained in a refrigerant line, a plurality of evaporators configured for thermal attachment to the components, and a supplemental heating system. The refrigeration system and the supplemental heating system are operable to maintain each of the plurality of components within the predetermined temperature range.

Additionally, the present invention pertains to a method for thermally regulating multiple components of a computer system having multiple fluctuating heat loads. In the method, a flow of a refrigerant is controlled through a refrigerant line in a refrigeration system. The refrigeration system includes a variable capacity compressor, a plurality of evaporators, and a valve. The evaporators are configured for thermal attachment to the multiple components. The valve is configured to meter the flow of the refrigerant through the plurality of evaporators. A temperature of the refrigerant is sensed in a position generally downstream of the plurality of evaporators and the flow of the refrigerant through the plurality of evaporators is modified in response to the temperature being outside a predetermined superheat temperature range.

In accordance with another aspect, the present invention relates to a multi-load thermal regulating system for maintaining individual temperatures of a plurality of heat generating components within a predetermined temperature range. The thermal regulating system includes a plurality of evaporators. Each of the evaporators is thermally attachable to a respective heat generating component. The plurality of evaporators are connected in a serial arrangement. The thermal regulating system further includes a plurality of supplemental heaters. Each of the supplemental heaters is operable to supply supplemental heat to a respective component of the heat generating components. The thermal regulating system further includes a refrigerant line for conducting refrigerant through the plurality of evaporators and a variable capacity compressor. The variable capacity compressor is connected to the refrigerant line and operable to control the mass flow rate of the refrigerant through the refrigerant line. The thermal regulating system further includes a thermostatic expansion valve connected to the refrigerant line and configured to be manipulated by a superheat sensor. Thus, the thermostatic expansion valve is operable to control the superheat of the refrigerant between the thermostatic expansion valve and the superheat sensor. The thermal regulating system further includes a proportional, integral, derivative controller configured to transmit signals to the variable capacity compressor to vary the mass flow rate of the refrigerant in response to a plurality of sensed temperature measurements measured by a plurality of component temperature sensors.

BRIEF DESCRIPTION OF THE DRAWINGS

Features and advantages of the present invention will become apparent to those skilled in the art from the following description with reference to the drawings, in which.

DETAILED DESCRIPTION OF THE INVENTION

For simplicity and illustrative purposes, the principles of the present invention are described by referring mainly to an exemplary embodiment thereof, particularly with references to an electronic system possessing multiple heat producing components. However, one of ordinary skill in the art would readily recognize that the same principles are equally applicable to, and can be implemented in, any device that may benefit from multiple evaporators arranged in series, and that any such variation would be within such modifications that do not depart from the true spirit and scope of the present invention.

In accordance with the principles of the present invention, the temperature of a plurality of components in a multi-component system may be maintained within a specified temperature range while temperature variation among the components may be reduced. In this respect, the temperature of each component is maintained relatively constant (approximately within 5° C.) with respect to other components, while allowing for multiple fluctuating heat loads between the components. The present invention is configured to control the temperature of each component by utilizing a combination of a refrigeration system (e.g., a vapor compression refrigeration system) and a supplemental heater. Excess heat is removed from each component by a respective evaporator. In the event that a component is relatively inactive and therefore producing relatively less heat with respect to other components, the component temperature may fall below a predetermined temperature and the supplemental heater may ultimately add heat to the component, such that the temperature of the component may be raised to be within the specified temperature range. That is, the present invention is configured to independently maintain the temperature of each component by controlling the mass flow rate of refrigerant flowing through a series of evaporators, each evaporator being attached to a respective component, in conjunction with a supplemental heating system providing a means to compensate for fluctuations in temperature of individual components.

Figure 1:
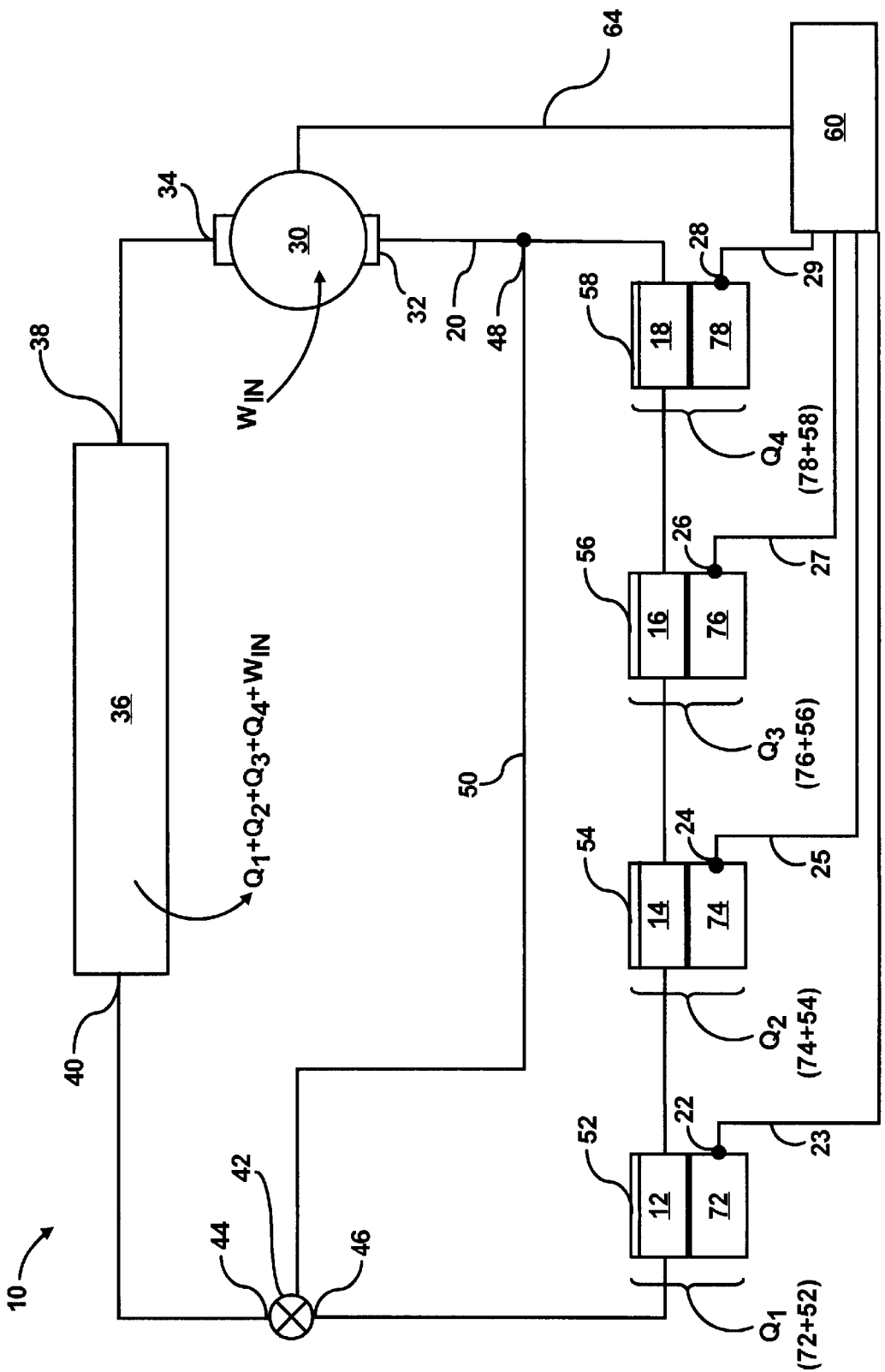
FIG. 1 illustrates a refrigeration system and a supplemental heating system for maintaining the temperature of a plurality of components in an electronics system in which a plurality of evaporators and supplemental heaters have been positioned in a serial configuration in accordance with the present invention.

In this respect, according to the principles of the present invention and as illustrated in FIG. 1, in a multi-load thermal regulating system 10, multiple evaporators 12, 14, 16, 18 (e.g., cold plates) are connected serially to one another to cool multiple components in an electronic system. A multi-load thermal regulating system 10, as referenced throughout the present disclosure, generally refers to a refrigeration system for cooling multiple heat loads (e.g., components) in conjunction with a supplemental heating system for maintaining the temperature of each heat load, of the forementioned multiple heat loads, within a predetermined range. Because the specific type of evaporator to be used in the present invention will vary according to individual needs, the present invention is not limited to any specific type of evaporator and may thus utilize any type of evaporator which may reasonably accomplish the goals of the present invention. Examples of suitable evaporators employable in the present invention are available from LYTRON, Inc. of Woburn, Mass. and THERMOTEK Co., LTD. of Texas and South Korea. However, as is readily apparent to those of ordinary skill in the art, other suitable evaporators may be used in the present invention without departing from the scope and spirit of the present invention.

Although FIG. 1 depicts four evaporators, it is to be understood that the present invention is not limited to four evaporators, but rather, the present invention may include any reasonable number of evaporators. In one respect, the number of evaporators may correspond to the number of heat generating components. Accordingly, the four evaporators depicted in FIG. 1 are for illustrative purposes only and thus is not meant to limit the present invention in any respect. Additionally, as is well known to those having ordinary skill in the art, the term "serial" is not intended to be a limitation, but rather, with respect to the present disclosure, describes the manner in which a single conduit may be controlled as a single unit.

Additionally, any suitable type of refrigerant may be utilized in the present invention. In fact, the choice of refrigerant will depend upon a plurality of factors, e.g., cooling requirements, environmental impact, cost, etc. Generally speaking, suitable refrigerants include the suite of vapor compression hydrocarbon refrigerants (CFCs, HCFSs, HFCs or any blend of pure refrigerants). Specific examples of suitable refrigerants include R134a, R290, R600, etc. Moreover, suitable refrigerants may be obtained from TONG TAI INTERNATIONAL located in Taiwan, R.O.C.

Referring again to FIG. 1, the multi-load thermal regulating system 10 possesses a closed loop for refrigerant to flow to and from the components of the multi-load thermal regulating system 10 (e.g., evaporator 12, evaporator 14, evaporator 16, evaporator 18, superheat sensor 48, compressor 30, condenser 36, and thermostatic expansion valve 42). Specific examples of suitable thermostatic expansion valves employable in the present invention are available from PARKER HANNIFIN CO. of Cleveland, Ohio.

According to the preferred embodiment illustrated in FIG. 1, the compressor 30 is a variable capacity (speed) compressor. In other words, the compressor 30 may be controlled to either increase or decrease the mass flow rate of the refrigerant within the multi-load thermal regulating system 10. According to the principles of the present invention, a number of different types of variable capacity (speed) compressors may be utilized for proper operation of the present invention. Thus, in similar fashion to other types of refrigeration systems, the refrigerant flowing through the refrigerant line 20 changes between a gas and a liquid at various positions as the refrigerant circuits the closed loop of the multi-load thermal regulating system 10. Additionally, as is well known to those having ordinary skill in the art, the term "variable capacity compressor" is not intended to be a limitation, but rather, with respect to the present disclosure, describes a compressor in which the capacity may be controlled by manipulating the manner in which the compressor operates. Thus, when the operation of the variable capacity (speed) compressor is modified, the refrigerant mass flow rate may be altered in a like manner, e.g., as compressor speed is increased, mass flow rate is increased and thus increase the capacity of the refrigerant to cool a component attached to the refrigeration system. Moreover, the capacity of the compressor 30 may be varied from about 0 to about 100% capacity of the compressor and substantially any capacity therebetween. However, it is within the purview of this invention that any known compressor capable of suitably varying refrigerant capacity in a controlled manner may be substituted for the variable capacity (speed) compressor without departing from the scope and spirit of the invention.

Although not specifically shown in FIG. 1, the evaporators 12–18 are configured for attachment to respective heat generating components by any known means which allows for adequate thermal transfer from the components to the evaporators. Thus, each evaporator 12–18 may absorb the heat load from a respective Q1–Q4. Each Q1–Q4 illustrated in FIG. 1 represents the combined heat load of a respective component 72–78 and a corresponding supplemental heater 52–58. For example, evaporator 12 may be thermally attached to a component 72 and a supplemental heater 52. Thus, Q1 is substantially equal to the heat load of component 72 plus the heat load of the supplemental heater 52.

Although not specifically shown in FIG. 1, any suitable configuration of component, evaporator and supplemental heater may be utilized in the present invention. In fact, the choice of configuration will depend upon a plurality of factors, e.g., cooling requirements, design constraints, condensation control, space requirements, system optimization, cost, etc. Generally speaking, suitable configurations include those that allow heat to substantially freely move from a component to a respective evaporator and moreover, from a supplemental heater to a respective component. Specific examples of suitable configurations may include: each evaporator 12–18 being located between a respective component 72–78 and a respective supplemental heater 52–58; each component 72–78 being located between a respective supplemental heater 52–58 and a respective evaporator 12–18; and each supplemental heater 52–58 being located upstream of a respective evaporator 12–18.

Generally speaking, the suitability of supplemental heaters will depend upon a plurality of factors, e.g., cost, supplemental heater placement, specific power requirements, etc. Specific example of a suitable heater include silicon rubber heaters and kapton heaters. Moreover, suitable heaters may be obtained from OMEGA Inc. of Stamford, Conn., and WATLOW ELECTRIC MANUFACTURING CO. of St. Louis, Mo. Although not specifically shown in FIG. 1, the supplemental heaters 52–58, may each be independently controlled by a controller. Although any suitable controller may be utilized with the present invention, examples of suitable controllers include I-SERIES controllers manufactured by OMEGA Inc. of Stamford, Co., and WATLOW ELECTRIC MANUFACTURING CO. of St. Louis, Mo. The manner in which the controller may control the supplemental heaters 52–58 will be discussed in greater detail hereinbelow.

In operation, refrigerant, in multiphase (i.e., liquid and gas) form, flows through the series of evaporators 12–18 at a controlled mass flow rate. The term "controlled mass flow rate" in this context refers to the regulation of refrigerant flow through the series of evaporators 12–18, such that the amount of refrigerant flow is contingent upon the combined heat load of Q1–Q4. According to a preferred embodiment of the invention, the heat load produced by each supplemental heater 52–58 is independently controlled such that each corresponding component 72–78 substantially receives relatively only a sufficient amount of beat to maintain the temperature of the corresponding component 72–78 above a predetermined minimum temperature. In this respect, when a component 72, for example, produces relatively less heat than the other components 76–78, the supplemental heater 52 may produce heat, such that, the amount of heat produced is dependent upon the amount of heat required to raise the temperature of component 72 to be above a predetermined minimum temperature.

Referring again to FIG. 1, refrigerant enters the compressor 30 through a compressor inlet 32. The compressor 30 increases the pressure and temperature of the refrigerant before the refrigerant exits through a compressor outlet 34. The compressor 30 may impart some additional heat ("$W_{IN}$") on the refrigerant as the refrigerant is compressed. The speed of the compressor 30 and thus the level of compression of the refrigerant may be controlled by a proportional, integral, derivative controller with relay ("PID") 60. The manner in which the compression level is controlled by altering compressor capacity will be discussed in greater detail below.

The refrigerant then flows through the refrigerant line 20 into a condenser 36 through a condenser inlet 38. The condenser 36 is capable of dissipating the combined Q1–Q4 plus $W_{IN}$ from the refrigerant. Within the condenser 36, in a process known to those skilled in the art, the refrigerant generally decreases in temperature. The refrigerant exits the condenser 36 through a condenser outlet 40, typically as a liquid (still at a relatively high pressure and temperature). The refrigerant then flows through the refrigerant line 20 into a thermostatic expansion valve 42 through a thermostatic expansion valve inlet 44. The thermostatic expansion valve 42 may be a regulated needle valve capable of enabling a specified refrigerant superheat to be generated within the refrigerant line 20 between the thermostatic expansion valve 42 and the superheat sensor 48. In this regard, the superheat sensor 48 may modulate the pressure of a fluid within a thermostatic control line 50 in response to a sensed refrigerant temperature such that the thermostatic expansion valve 42 may regulate the mass flow of the refrigerant in refrigerant line 20 to allow adequate superheat to be imparted on the refrigerant to ensure the refrigerant enters the compressor 30 as a gas. However, it is within the purview of this invention that any known expansion valve that suitably reduces the mass flow rate of the refrigerant fluid, thereby enabling the refrigerant fluid to absorb sufficient heat to ensure that the refrigerant is in a gaseous state upon entering the compressor at inlet 32, may be substituted for the thermostatic expansion valve 42 without departing from the scope and spirit of the invention. It is important that the refrigerant enters the compressor 30 as a gas because liquid, being incompressible, may damage the compressor 30 due to excessive pressure created by attempting to compress an incompressible fluid.

After exiting the thermostatic expansion valve 42 through a thermostatic expansion valve outlet 44, refrigerant flows through the refrigerant line 20 and enters the evaporators 12–18 by first going through the evaporator 12. Within the evaporator 12 the refrigerant receives (i.e., absorbs) the heat load Q1. As can be seen in FIG. 1, the heat load Q1 represents the combined heat load of a component 72 and a supplemental heater 52. The refrigerant then exits the evaporator 12, flows through the refrigerant line 20, and the process is repeated for evaporator 14, evaporator 16, and evaporator 18, whereupon the refrigerant exits the evaporator 18, having absorbed sufficient heat load to maintain the temperature of the components 72–78 within a predetermined temperature range. Thus, in one respect, the heat load of the multi-load thermal regulating system 10 may be monitored to control compressor speed and thus the mass flow rate of refrigerant. According to a preferred embodiment, the temperatures of the components 72–78 ("$T_{72}$–$T_{78}$") are measured by temperature sensors 22–28. Although any suitable type of temperature sensor may be utilized in the present invention, examples of suitable temperature sensors include a thermocouple, thermistor, diode, temperature sensitive resistor, and the like. The temperature sensors 22–28 are connected to the PID 60 via input lines 23–29. The PID 60 is further connected to the compressor 30 via an output line 64. The PID 60 is configured to control the amount of compression the compressor 30 applies to the refrigerant based upon the measured $T_{72}$–$T_{78}$, of the components, to thereby control the mass flow rate of the refrigerant throughout the multi-load thermal regulating system 10. Although any suitable PID 60 may be utilized with the present invention, examples of suitable PID's 60 include those manufactured by OMEGA Inc. of Stamford, Conn., and WATLOW ELECTRIC MANUFACTURING CO. of St. Louis, Mo. According to a preferred embodiment, the temperature sensors 22–28 are integrated within the components 72–78 or, the temperature sensors 22–28 may be attached to respective components 72–78 by any known means which allows for thermal transfer from the components to the temperature sensors 22–28. However, the temperature sensors 22–28 may be positioned to measure the temperature of the evaporators 12–18 without deviating from the scope and spirit of the present invention.

The temperature sensors 22–28 may be connected to a controller (not shown) configured to control the supplemental heaters 52–58. In addition, the controller may be capable of receiving the $T_{72}$–$T_{78}$ from separate temperature sensors in addition to those illustrated in FIG. 1. In either event, it is generally within the scope and spirit of the present invention that the controller receive the respective component temperatures $T_{72}$–$T_{78}$. The controller may be configured to independently control each supplemental heater 52–58, based on the $T_{72}$–$T_{78}$. The controller may possess a delay counter configured to delay the manipulation of the supplemental heaters 52–58 by a predetermined amount of time. Generally speaking, the predetermined amount of time will depend upon a plurality of factors, e.g., system application, compressor size, thermal response time of evaporators, refrigerant flow rate, optimization, etc. Moreover, separate controllers may be utilized to control each of the supplemental heaters 52–58 without deviating from the scope and spirit of the present invention.

Figure 2:
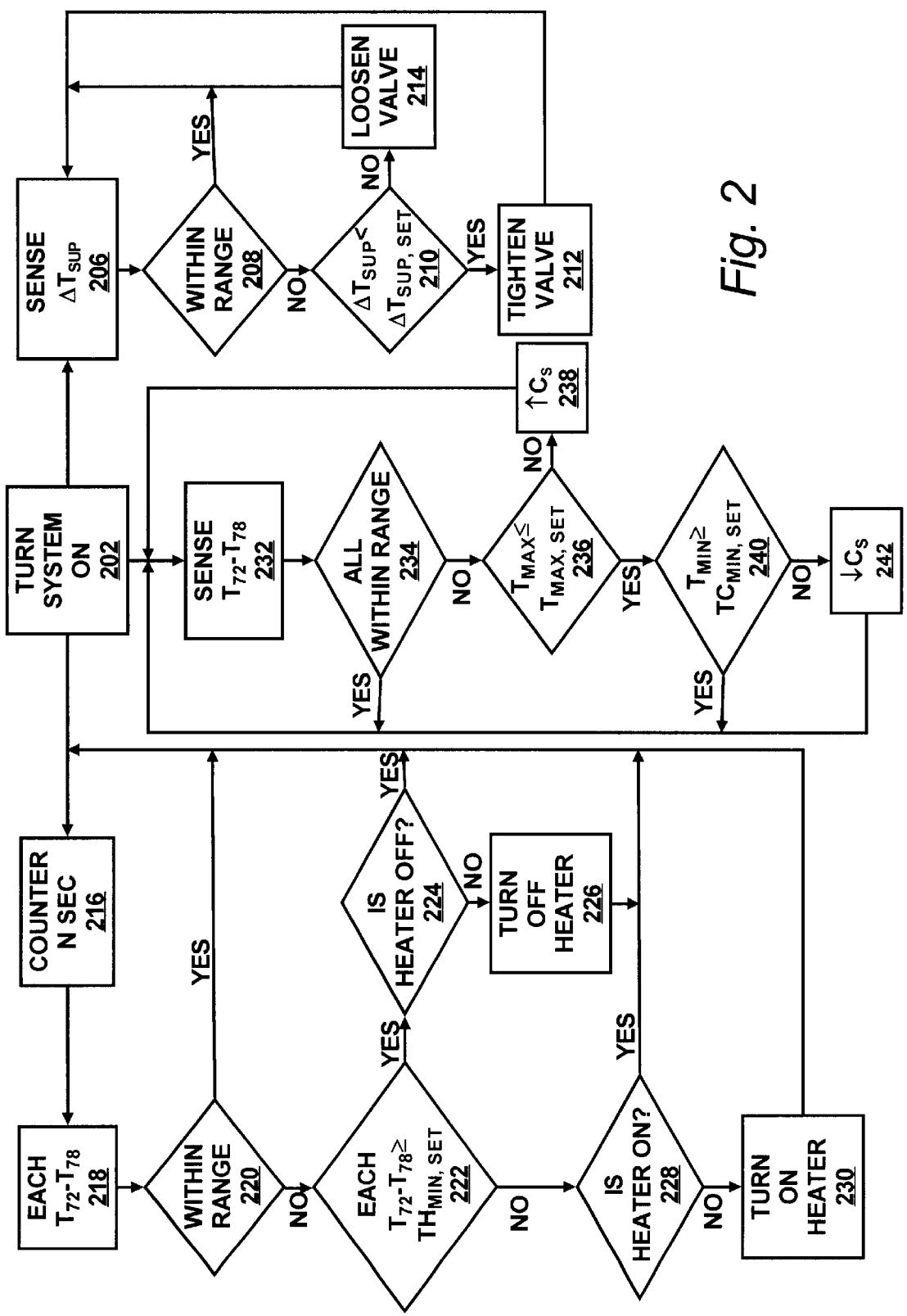
FIG. 2 is a flow chart depicting a manner in which the embodiment illustrated in FIG. 1 may be practiced.

FIG. 2 is a flow diagram 200 depicting a manner in which the embodiment illustrated in FIG. 1 may be practiced. Accordingly, the following description of FIG. 2 will be made with particular reference to those features illustrated in FIG. 1. As seen in FIG. 2, after the multi-load thermal regulating system 10 is turned on at step 202, the refrigerant begins to flow through the multi-load thermal regulating system 10. The refrigerant temperature ("$\Delta T_{SUP}$") is measured by superheat sensor 48 at step 206. In step 208, it is determined if the $\Delta T_{SUP}$ is within a predetermined temperature range. The predetermined temperature range is determined based upon system design and the amount of load variability expected among the components. In general, the predetermined temperature range may depend upon the following factors: system application, compressor size, thermal response time of evaporators, optimization of the system, refrigerant flow rate, etc. The predetermined temperature range may be between about 0° C. and 10° C. If the $\Delta T_{sup}$ is within the predetermined range, the $\Delta T_{SUP}$ is measured again in step 206. If the $\Delta T_{SUP}$ is determined to be outside of the predetermined range, the $\Delta T_{sup}$ is compared to a predetermined set temperature ("$\Delta T_{SUP,SET}$") in step 210. If, in step 210, the $\Delta T_{SUP}$ is determined to be less than $\Delta T_{SUP,SET}$, the thermostatic expansion valve 42 is manipulated to reduce the flow of refrigerant through the thermostatic expansion valve 42 in step 212. If, in step 210, the $\Delta T_{SUP}$ is determined to be greater than or equal to the $\Delta T_{SUP,SET}$, the thermostatic expansion valve 42 is manipulated to increase the flow of refrigerant through the thermostatic expansion valve 42 in step 214. After each step 212 and 214, the $\Delta T_{SUP}$ is measured again in step 206.

Additionally and concurrently with steps 206–214 above, in step 216, a counter may be initialized at 0 seconds and at N seconds later, the $T_{72}$–$T_{78}$ is sensed in step 218. The time N seconds is determined based upon system design and the amount of load variability expected among the components. In general, the time N may depend upon the following factors: system application, compressor size, thermal response time of evaporators, optimization of the system, refrigerant flow rate, etc. The following steps 218–230 are performed independently and substantially concurrently for each supplemental heater 52–58. In the following discussion, although specific reference is made to the manner of controlling the temperature of component 72 utilizing supplemental heater 52, it is to be understood that steps 218–230 are carried out for each of the supplemental heaters 52–58, independently of one another and may be carried out simultaneously. For example, in step 218, the temperature of component 72 ("$T_{72}$") is sensed by a respective temperature sensor 22 and relayed to a controller configured to operate the supplemental heater 52.

In step 220, it is determined if the $T_{72}$ is within a predetermined range. The predetermined range is determined based upon system design and the amount of load variability expected among the components 72–78. In general, the predetermined range may depend upon the following: electrical timing requirements, allowable mechanical stress due to thermal expansion, proximity to dew point, etc. If the $T_{72}$ is within the predetermined range, the counter is again initialized to 0 seconds in step 216. If the $T_{72}$ is determined to be outside of the predetermined range, the $T_{72}$ is compared to a predetermined minimum temperature set point ("$TH_{MIN,SET}$") in step 222. The $TH_{MIN,SET}$ is determined based upon the predetermined minimum temperature used in the control of the compressor 30, as well as, system design and the amount of load variability expected among the components. In general, the $TH_{MIN,SET}$ may depend upon the following factors: system application, proximity to dew point, compressor size, thermal response time of evaporators, optimization of the system, refrigerant flow rate, etc. If, in step 222, the $T_{72}$ is determined to be greater than or equal to the $TH_{MIN,SET}$, the on/off status of the supplemental heater 52 is determined in step 224. If, in step 224, it is determined that the supplemental heater 52 is off, the counter is again initialized to 0 seconds in step 216. If, in step 224, it is determined that the supplemental heater 52 is on, the supplemental heater 52 is turned off in step 226. If, in step 222, the $T_{72}$ is determined to be less than the $TH_{MIN,SET}$, the on/off status of the supplemental heater 52 is determined in step 228. If, in step 228, it is determined that the supplemental heater 52 is on, the counter is again initialized to 0 seconds in step 216. If, in step 228, it is determined that the supplemental heater 52 is off, the supplemental heater 52 is turned on in step 230. After each step 226 and 230, the counter is again initialized to 0 seconds in step 216.

It is to be understood that the above-description of the present invention made specific reference to supplemental heater 52 for illustrative purposes only and that the manner in which supplemental heater 52 may be manipulated is equally applicable to the other supplemental heaters 54–58. Additionally, it is to be understood that by way of the principles of the present invention, each of the supplemental heaters 52–58 may be independently and simultaneously operated.

The following steps 232–242 may occur independently and concurrently with the above steps 206–230. In step 232, the $T_{72}$–$T_{78}$ are sensed by respective temperature sensors 22–28. The $T_{72}$–$T_{78}$ measurements are then relayed to a logic controller (not shown) attached to the PID 60 via the input lines 23–29 and, in step 234, the logic controller determines if the $T_{72}$–$T_{78}$ are each within a predetermined range and relays controls to the PID 60 accordingly. The predetermined range is determined based upon system design and the amount of load variability expected among the components. In general, the predetermined range may depend upon the following: system application, compressor size, thermal response time of evaporators, optimization of the system, refrigerant flow rate, etc. If each of the $T_{72}$–$T_{78}$ is within the predetermined range, the $T_{72}$–$T_{78}$ are measured again in step 232. If any of the $T_{72}$$T_{78}$ is determined to be outside of the predetermined range, the maximum component temperature ("$T_{MAX}$") of the measured temperatures $T_{72}$–$T_{78}$ is compared to a predetermined maximum temperature set point ("$T_{MAX,SET}$") in step 236. The $T_{MAX,SET}$ is determined based upon system design and the amount of load variability expected among the components. In general, the $T_{MAX,SET}$ may depend upon the following: component manufactures specifications, system application, proximity to dew point, compressor size, thermal response time of evaporators, optimization of the system, refrigeration flow rate, etc.

If, in step 236, the $T_{MAX}$ is determined to be greater than the $T_{MAX,SET}$, the PID 60 may control the compressor 30 via the output line 64 to increase its speed, in step 238. If, in step 236, the $T_{MAX}$ is determined to be less than or equal to the $T_{MAX,SET}$, the minimum component temperature ("$T_{MIN}$") of the measured temperatures $T_{72}$–$T_{78}$ is compared to the predetermined minimum temperature used in the control of the compressor 30 ("$TC_{MIN,SET}$") in step 240. The $TC_{MIN,SET}$ is configured to operate in conjunction with the $TH_{MIN,SET}$. The $TC_{MIN,SET}$ is determined based upon the system design and the amount of load variability expected among the components. In general, the $TC_{MIN,SET}$ may depend upon the following factors: system application, proximity to dew point, compressor size, thermal response time of evaporators, optimization of the system, refrigerant flow rate, etc.

If, in step 240, the $T_{MIN}$ is determined to be less than the $TC_{MIN,SET}$, the PID 60 may control the compressor 30 via the output line 60 to decrease its speed, in step 242. If, in step 240, the $T_{MIN}$ is determined to be greater than or equal to the $TC_{MIN,SET}$, the $T_{72}$–$T_{78}$ are measured again in step 232. Additionally, after each step 236 and 240, the $T_{72}$–$T_{78}$ are measured again in step 232.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A multi-load thermal regulating system for maintaining individual temperatures of a plurality of heat generating components within a predetermined temperature range, said thermal regulating system comprising:

a plurality of evaporators, each of said evaporators being thermally attachable to a respective heat generating component, said plurality of evaporators being connected to each other in a serial arrangement;

a plurality of supplemental heaters, each of said supplemental heaters operable to supply supplemental heat to respective ones of said heat generating components;

a refrigerant line for conducting refrigerant through said plurality of evaporators;

a variable capacity compressor connected to said refrigerant line and operable to control the mass flow rate of said refrigerant through said refrigerant line;

a thermostatic expansion valve connected to said refrigerant line and configured to be manipulated by a superheat sensor, wherein said thermostatic expansion valve is operable to control the superheat of said refrigerant between said thermostatic expansion valve and said superheat sensor; and a proportional, integral, derivative controller configured to transmit signals to said variable capacity compressor to vary the mass flow rate of said refrigerant in response to a plurality of sensed temperature measurements measured by a plurality of component temperature sensors.

2. A thermal regulating system for maintaining temperatures of a plurality of heat generating components within predetermined temperature ranges, said thermal regulating system comprising:

a refrigeration system comprising a compressor, a plurality of evaporators, and a refrigerant line containing refrigerant, said refrigerant line being configured to enable flow of refrigerant through said compressor and said plurality of evaporators, said refrigerant line serially connects said plurality of evaporators, and wherein the refrigerant in the evaporators is configured absorb heat generated by said plurality of heat generating components;

a plurality of supplemental heaters configured to apply heat to said plurality of evaporators based upon the temperatures of the plurality of heat generating components; and wherein said refrigeration system and said supplemental heaters are configured to maintain the plurality of heat generating components within the predetermined temperature range.

3. The system according to claim 2, wherein said compressor comprises a variable capacity compressor configured to vary a mass flow rate of refrigerant flow in the refrigerant line, and wherein an evaporator of the plurality of evaporators is configured to absorb heat generated by one heat generating component of said plurality of heat generating components.

4. The system according to claim 3, further comprising:

a proportional, integral, derivative controller configured to operate said variable capacity compressor.

5. The system according to claim 4, further comprising:

a plurality of temperature sensors configured to detect the temperatures of the heat generating components, wherein said proportional, integral, derivative controller is configured to receive the detected temperatures and operate the variable capacity compressor based on the detected temperatures of the heat generating components.

6. The system according to claim 2, further comprising:

a superheat sensor positioned downstream of the plurality of evaporators to detect superheat in the refrigerant exiting the plurality of evaporators; and a thermostatic expansion valve located on stream of the plurality of evaporators along the refrigerant line, said thermostatic expansion valve being configured to vary a mass flow rate of the refrigerant based upon the detected superheat.

7. A system for maintaining temperatures of a plurality of heat generating components within a predetermined temperature range, said system comprising:

means for absorbing heat generated by the heat generating components, said heat absorbing means being arranged serially relative to each other;

means for cooling a refrigerant heated in the heat absorbing means; and means for supplying supplemental heat to the heat absorbing means to control a temperature of refrigerant flowing therethrough.

8. The system according to claim 7, wherein said means for cooling a refrigerant comprises a variable capacity compressor.

9. The system according to claim 8, further comprising:

means for detecting the temperatures of the plurality of heat generating components; and means for controlling the variable capacity compressor based on the detected temperatures of the plurality of heat generating components.

* * * * *